United States Patent [19]
Sugiyama et al.

[11] Patent Number: 5,898,200
[45] Date of Patent: Apr. 27, 1999

[54] MICROWAVE INTEGRATED CIRCUIT

[75] Inventors: Toru Sugiyama, Tokyo; Kouhei Morizuka, Kanagawa, both of Japan

[73] Assignee: Kabushiki Kaisha Toshiba, Kawasaki, Japan

[21] Appl. No.: 08/933,105

[22] Filed: Sep. 18, 1997

[30] Foreign Application Priority Data

Sep. 18, 1996 [JP] Japan .................................. 8-246464

[51] Int. Cl.$^6$ ........................... H01L 29/76; H01L 29/94; H01L 31/062; H01L 31/113
[52] U.S. Cl. ........................... 257/330; 257/401; 257/398
[58] Field of Search ..................................... 257/330, 372, 257/401, 397, 398

[56] References Cited

U.S. PATENT DOCUMENTS

Re. 31,580  5/1984  Kooi .
4,890,141  12/1989  Tang et al. .

FOREIGN PATENT DOCUMENTS 7-22310  1/1995  Japan .

OTHER PUBLICATIONS

Tsuneo Tokumitsu et al., "Three–Dimensional MMIC Technology: A Possible Solution to Masterslice MMIC's on GaAs and Si," IEEE Microwave and Guided Wave Letters, vol. 5, No. 11, Nov. 1995, pp. 411–413.

*Primary Examiner*—Stephen D. Meier
*Attorney, Agent, or Firm*—Foley & Lardner

[57] ABSTRACT

Disclosed in a microwave integrated circuit, having a semiconductor substrate on which a field effect transistor is formed, a micro strip line, a contact hole and an interconnecting line. The microstrip line comprises a ground conductor, a signal line and a dielectric film interposed between the ground conductor and the signal line, and it is laminated on the semiconductor substrate. The contact hole is formed in the micro strip line so that the dielectric film above the field effect transistor is removed, and the interconnecting line is provided in the contact hole for connecting the field effect transistor with the ground conductor or signal line of the micro strip line.

20 Claims, 7 Drawing Sheets

MICROWAVE INTEGRATED CIRCUIT

BACKGROUND OF THE INVENTION

1. Field of the Invention

The present invention relates to a microwave integrated circuit.

2. Description of the Prior Art

In recent years, development of various devices using a microwave circuit such as a local wireless LAN, a millimeter wave radar and the like has been made. In this development, the most significant matter is to simply and cheaply manufacture the microwave circuit. In order to reduce the manufacture cost of the microwave circuit, it is the most effective means to make small the dimension of a chip with the microwave circuit. Thus, the circuits which are not generally employed are of the type that is called a monolithic microwave integrated circuit (MMIC). As shown in FIG. 1, the monolithic microwave integrated circuit is a circuit having a micro strip line structure in which electronic devices such as MESPET, HEMT and the like and a transmission line such as a micro strip line and the like are integrated together on a GaAs substrate. In the MMIC chip, it is possible to make small the dimension of the chip. However, the manufacture process of the MMIC chip is difficult and its yield is also low. More specifically, as shown in FIG. 1, the micro strip line structure, in general, has a signal line 5 which is formed on one side or surface side of the GaAs substrate 1 and a ground conductor 3 which is formed on the opposite side or the back side thereof. However, the process for forming this structure is very difficult, because the GaAs substrate usually having 650 micron must be made thin up to a thickness of a degree of 50 micron so as to form a micro strip line between the surface and back sides of the substrate. As a result, the strength of substrate is reduced. Moreover, in order to make contact with the ground conductor 3 on the back side of the substrate, a via hole must be formed in the GaAs substrate having a thickness of 50 micron. However, this formation process is also very difficult.

Taking such circumstances into consideration, there has been proposed a method of forming a thin film micro strip line on the GaAs substrate (this structure is called reverse micro strip line structure, ref. FIG. 2), in order to readily form the micro strip line. In this method, a dielectric film 7 made of resin is formed on the surface of the GaAs substrate 1, and the ground conductor 3 is further provided on the dielectric film 7, thereby constructing a micro strip line using the dielectric film 7 as an interlayer dielectric. With the construction as described above, there is no need of making thin the GaAs substrate 1 and forming a via hole in the GaAs substrate 1. Therefore, the manufacture process is easy. However, the dielectric film is formed on the electronic device such as HEMT and MESFET. In accordance with this structure, in order to connect the micro strip line with these electronic devices, there is a need of forming a contact hole in the interlayer dielectric film 7, as shown in FIG. 2 (hereinafter, reference numerals G, D and S in the accompanied drawings denote a gate electrode, a drain electrode and a source electrode of electronic device, respectively). Then, if the thickness of the dielectric film 7 becomes thick, the contact hole must be formed large. As a result, the dimension of the MMIC type chip also becomes large. Moreover, in the reverse micro strip line structure, the signal line 5 and the dielectric film 7 with specific dielectric constant of being about 3 are formed on the GaAs substrate with dielectric constant of being 13, and further, the ground conductor 3 is formed thereon as the uppermost layer. In the structure as described above, an electric field is generated as shown by an arrow E of FIG. 3. In this state, effective dielectric constant changes depending upon interconnecting pattern. Then, if the effective dielectric constant changes, an effective wavelength also changes. Due to the changes as described above, a design of microwave circuit cannot help being complicated.

Meanwhile, in order to solve the above problem, there has also been proposed an MMIC chip which employs a thin film micro strip line having a normal micro strip line structure as shown in FIG. 4. In this structure, the ground conductor 3 is formed adjacent to the GaAs substrate 1. Therefore, an electric field E is substantially closed between the signal line 5 and the ground conductor 3, as shown in FIG. 5. Accordingly, effective dielectric constant is determined substantially by the interlayer dielectric film 7. Therefore, a design of microwave circuit is easy. However, this structure also needs to form a contact hole in the dielectric film 7 in order to mutually connect the signal line 5 of the micro strip line and the electronic device, and, if the dielectric film 7 is formed thick, the contact hole must be also formed larger. In accordance with this, as shown in FIG. 6, a distance d from the electronic device to the micro strip line end becomes long in order to secure a margin between contact holes. The distance d is hard to handle as a model when making a design of circuit, and it produces inductive reactance which cannot be neglected when a millimeter wave band having a short wavelength, etc. is utilized. Therefore, it is difficult to make an alignment of electronic devices with interconnecting liens. Moreover, in the case where the dielectric film is formed on electronic devices such as HEMT and MESFET, gate-to-source capacitance and gate-to-drain capacitance increase. As a result, high speed performance of these electronic devices deteriorates.

As is seen from the above description, in the MMIC chips having electronic devices such as HEMT and MESFET and a surface micro strip line using resin, to achieve cost reduction, it is desirable that the distance from electronic device to the micro strip line end is made short as much as possible so as to make small chip size and to enhance alignment with a design.

SUMMARY OF THE INVENTION

In order to solve the above problems, it is an object of the present invention to provide a microwave semiconductor device or a microwave integrated circuit which has smaller chip size and high performance in well accordance with the designed one.

The microwave integrated circuit according to the present invention comprises: a semiconductor substrate on which a field effect transistor is formed; a micro strip line comprising a ground conductor, a signal line and a dielectric film interposed between the ground conductor and the signal line, the microstrip line being laminated on the semiconductor substrate; a contact hole which is formed in the micro strip line so that the dielectric film above the field effect transistor is removed; and an interconnecting line provided in the contact hole for connecting the field effect transistor with the ground conductor or signal line of the micro strip line.

The microwave integrated circuit is a monolithic microwave integrated circuit, and the contact hole is a single contact hole for the field effect transistor.

The dielectric film is a photosensitive thermosetting resin.

The photosensitive thermosetting resin includes photosensitive polyimide or photosensitive BCB.

The field effect transistor is a high electron mobility transistor.

The semiconductor substrate is a GaAs substrate, and the field effect transistor is a HEMT or MESFET.

The micro strip line is arranged so that the signal line is situated nearer to the semiconductor substrate than the ground conductor, and the interconnecting line connects the ground conductor with the field effective transistor in the contact hole.

Alternatively, the micro strip line is arranged so that the ground conductor is situated nearer to the semiconductor substrate than the signal line, and the interconnecting line connects the signal line with the field effect transistor in the contact hole.

The microwave integrated circuit has a plurality of said micro strip lines and a plurality of said interconnecting line in the contact hole so as to connect with the signal line of each of said plurality of the micro strip lines.

The microwave integrated circuit is further provided with a MIM capacitor.

The microwave integrated circuit is further provided with a passivation film for masking the field effect transistor and the dielectric film.

The passivation film is formed in such a manner that the passivation film is usable as a dielectric part of the MIM capacitor for generating interelectrode capacitance.

The microwave integrated circuit is further provided with a MIM capacitor which is laminated on the micro strip line.

Moreover, a microwave semiconductor device according to the present invention comprises a semiconductor substrate on which a field effect transistor is formed; a micro strip line comprising a ground conductor, a signal line and a dielectric film which is interposed between the ground conductor and the signal line, the microstrip line being laminated on the semiconductor substrate; a hole which is formed on the micro strip line so that the field effect transistor is not substantially covered by the dielectric film, in order to prevent parasitic capacitance accompanying the field effect transistor from being increased by the dielectric film of the micro strip line; and an interconnecting line provided in the contact hole for connecting the field effect transistor with the ground conductor or signal line of the micro strip line.

In accordance with the above construction, it is possible to make short a distance between the electronic device and the end of the surface micro strip line which uses a resin such as polyimide and the like. Therefore, downsizing in a MMIC chip can be achieve, and also, high alignment with a design can be achieved. Moreover, since no dielectric film is formed above the electronic devices such as HEMT, MESFET, the parasitic capacitance accompanying the electronic device can be reduced, and high speed performance can be improved.

The features and advantages of the microwave device according to the present invention over the proposed microwave device will be more clearly understood from the following description of the preferred embodiments of the present invention taken in conjunction with the accompanying drawings.

BRIEF DESCRIPTION OF THE DRAWINGS

In the accompanying drawings, like reference numerals designate the same or similar elements or sections throughout the figures thereof and in which.

DETAILED DESCRIPTION OF THE PREFERRED EMBODIMENTS

Inventors of the present invention have newly devised formation of a contact hole, and then, they have found that it is possible to achieve a scale-down in a distance from an electronic device to a micro strip line end and in the margin of the electronic devices, and to improve high frequency characteristics. Whereby downsizing in a chip of an MMIC can be realized. The present invention will be described below in detail.

Figure 7:
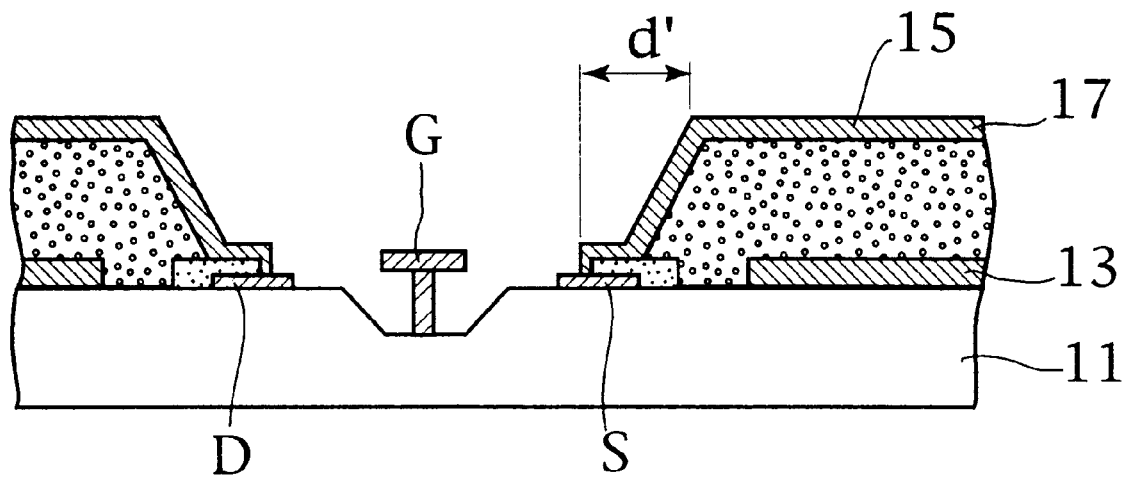
FIG. 7 is a schematic view showing a basic structure of a microwave integrated circuit according to the present invention.

As shown in FIG. 7, a microwave integrated circuit of the present invention has a structure in which the insulator (i.e., dielectric) 17 is removed above the electronic device so that a contact hole is formed over the electronic device formed on the semiconductor substrate, in order to connect the electric device with a micro strip line (signal line or ground conductor) 15 of the micro strip line structure formed on the semiconductor substrate. The structure as described above, first, serves to prevent deterioration in high speed performance of the electronic device due to an increase in capacitance of the dielectric 17. Moreover, a scale-down in the distance between the electronic devices and the micro strip line end can be achieved. Furthermore, the contact hole is formed so as to be situated over the electronic device, and is formed only one for each electronic device, and thereby, the margins of the electronic devices required for forming a contact hole can be made small. Therefore, the aforementioned structure is very effective in downsizing of chips.

An inductive reactance $\omega L$ is expressed by the following equation (1) in the case where the distance in a direction along the layer between the electronic device and the micro strip line end is d.

$$\omega L = ZO \tan(2\pi/\lambda \cdot d) \quad (1)$$

Wherein ZO is a characteristic impedance, and λ is an effective wavelength.

Figure 8:
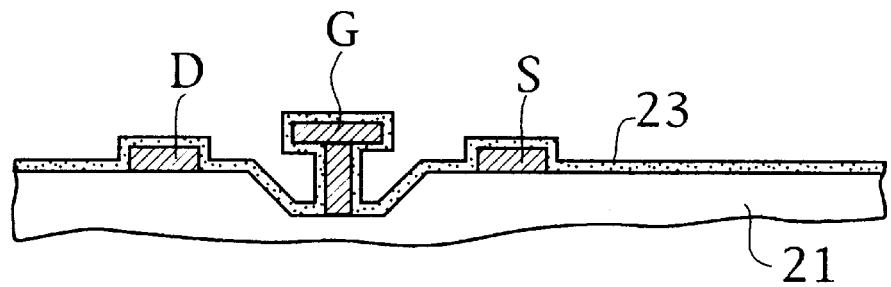
FIG. 8 is a view showing the initial step of a manufacturing process of a microwave integrated circuit according to the first embodiment of the present invention.

As is clearly understood from a comparison between the conventional structure of FIG. 8 and the structure of the present invention of FIG. 7, the contact hole is formed above the electronic device, and by this structure, it is possible to reduce the distance d to a shorter distance d' as shown in FIG. 7, which is about a half of the distance d. Therefore, the inductive reactance ωL becomes small in accordance with the reduction of the distance, and it is easy to make a design of a microwave circuit.

Taking stability of effective dielectric constant into consideration, the most preferably construction of the microwave integrated circuit is a normal micro strip structure such that the micro strip line 15 is a signal line, and that the line 13 is a ground conductor. Even in the case where the aforementioned construction is a reverse micro strip structure such that the micro strip line 15 is a ground conductor and the line 13 is a signal line, the effect as described above can be exhibited likewise.

In the microwave integrated circuit having the aforementioned construction, either of inorganic compound such as silicon dioxide or various resins may be used as a dielectric. In order to preferably manufacture a microwave integrated circuit of the present invention, it is convenient to use a photosensitive resin such as photosensitive polyimide. In the case where the dielectric layer is formed on the semiconductor substrate with use of inorganic compound such as silicon dioxide, there is a need of employing a technique such as RIE (Reactive Ion Etching), etc., to carry out patterning of the dielectric layer. In this case, when removing the dielectric layer laminated on the electronic device, the input/output parts of the electronic device, such as a gate, a source and a drain, are exposed to an environment which is considerably worse for them. For this reason, damage is easy to be given to these parts and the electronic device. However, if there is used the aforementioned photosensitive resin which is capable of carrying out patterning by exposure to light and development, the environment in which these parts and the electronic device are exposed is extremely calm. Therefore, no damage is given to the electronic device.

The following is a description on an example of a process for manufacturing the microwave integrated circuit having a normal micro strip line structure which uses photosensitive resin as a dielectric.

First, the electronic device such as HEMT and MESFET is formed on a semiconductor substrate, and thereafter, a ground electrode is laminated on a position of forming a micro strip line. And then, photosensitive resin is applied onto the overall surface of the semiconductor substrate as a dielectric layer, and patterning of photosensitive resin is carried out by exposure and development. In this patterning, as shown in FIG. 7, a single contact hole is formed over these electronic devices so that the photosensitive resin remains in only position where the micro strip line is to be formed. Thereafter, a signal line is formed on the dielectric layer, and thus a micro strip line is formed.

The aforementioned manufacture process will be explained in detail with reference to a first embodiment of the microwave integrated circuit of the present invention.

Figure 9:
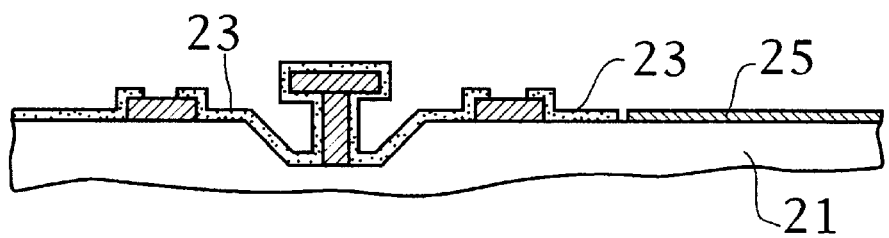
FIG. 9 is a view following the step shown in FIG. 8.
Figure 10:
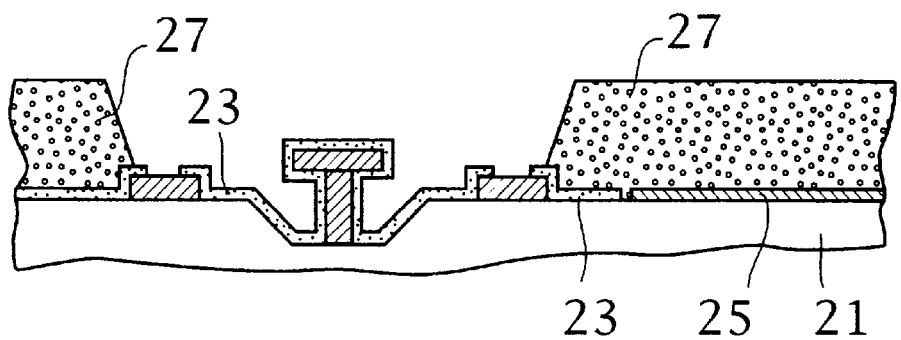
FIG. 10 is a view following the manufacturing step shown in FIG. 9.
Figure 11A:
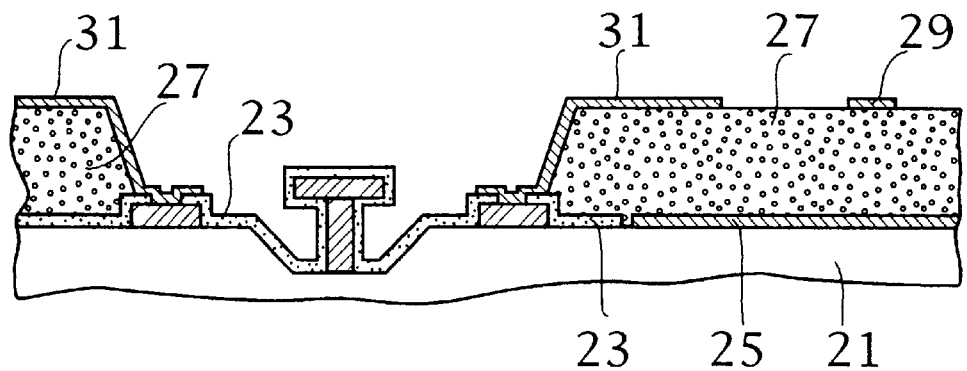
FIG. 11A is a view following the manufacturing step shown in FIG. 10.
Figure 11B:
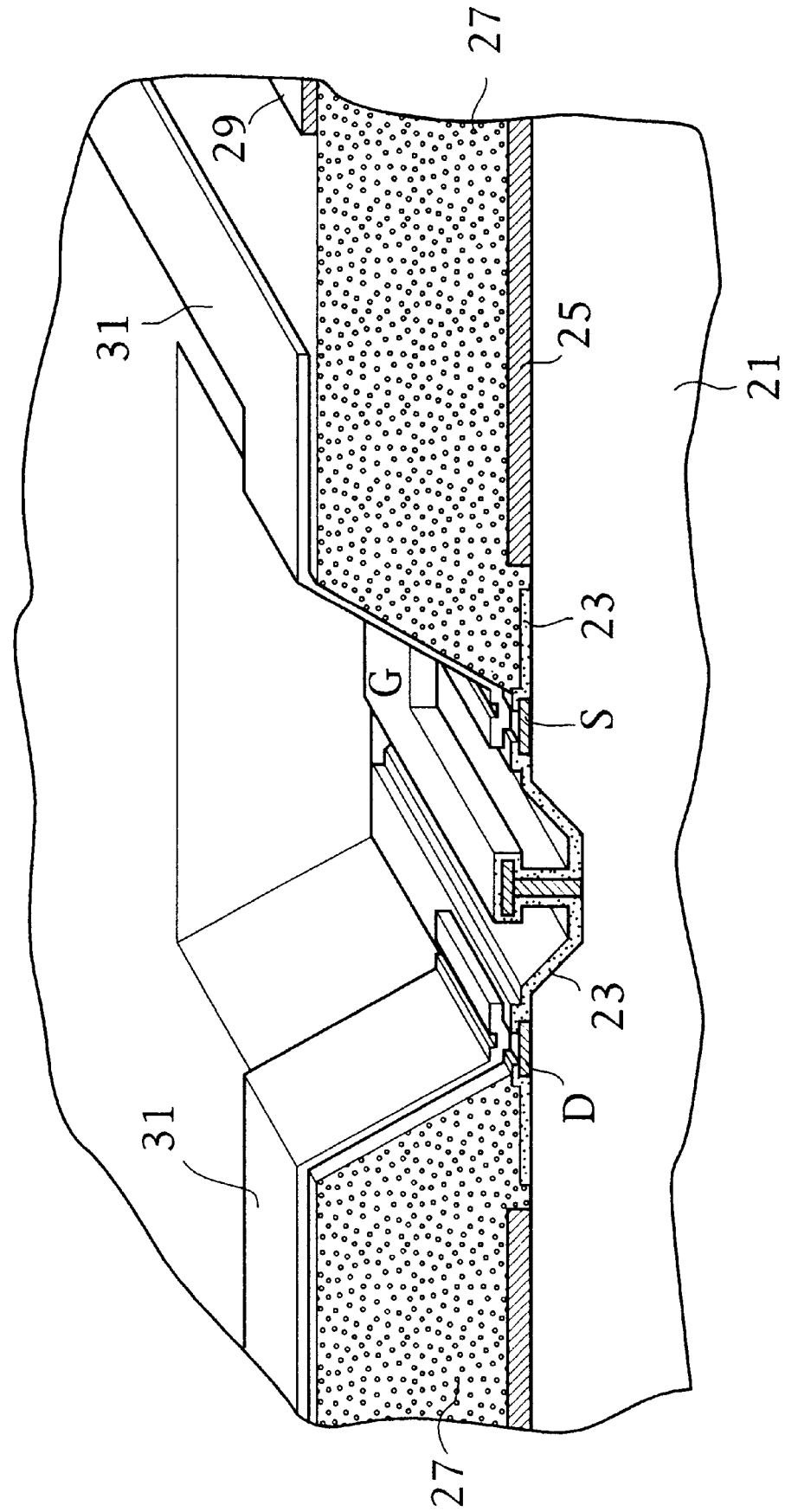
FIG. 11B is a perspective view of FIG. 11A.

First, as shown in FIG. 8, a HEMT is formed on a GaAs substrate 21 by a conventional HEMT formation process so that a silicon nitride film 23 of 80 nm is formed as a passivation film. Next, a formation pattern of a ground conductor of the micro strip line is made by photoresist treatment. Thereafter, a Ti/Au film is formed by vacuum evaporation, and then, as shown in FIG. 9, a ground conductor 25 (Ti/Au) is formed on a position where patterning is made by photoresist treatment, according to the lift-off method (see FIG. 9). Further, negative-type photosensitive polyimide (or, photosensitive benzo-cyclo-butene (BCB) may be used) is applied onto the overall surface, and exposure and development are made to the overall surface in a state of masking a portion of forming a via hole for making contact with the ground conductor and of masking the portion above the HEMT device. As a result of this operation, as shown in FIG. 10, a polyimide resin layer (or BCB layer) 27 is formed on only the portion to forming a micro strip line. And then, an interconnecting pattern is formed by photoresist treatment, and thereafter, a Ti/Au film is formed by vacuum evaporation. Moreover, as shown in FIG. 11A, a signal line 29 of the micro strip line and an interconnecting electrode 31 are formed by the lift-off method. FIG. 11B is a perspective view of the microwave integrated circuit of FIG. 11A.

Figure 12:
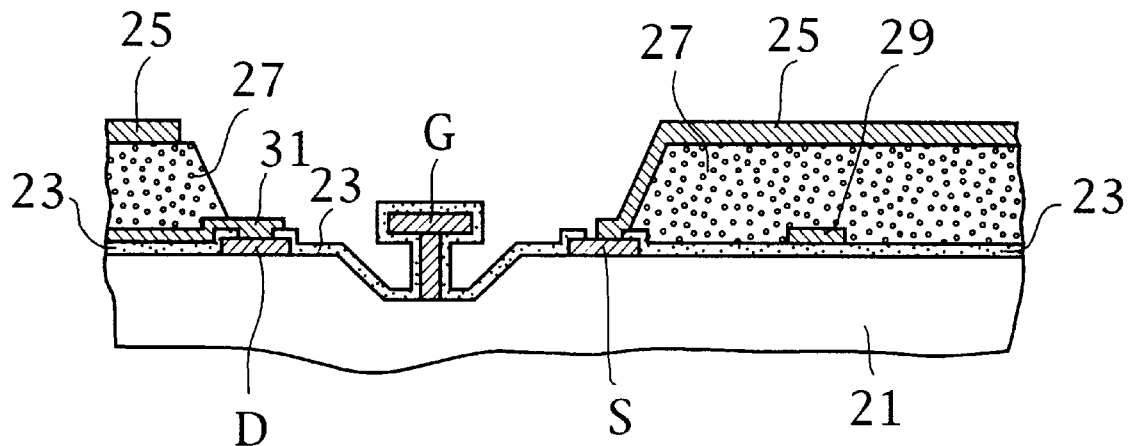
FIG. 12 is a schematic view showing a microwave integrated circuit according to the second embodiment of the present invention.

FIG. 12 shows a second embodiment of the present invention. A manufacturing process of this embodiment is substantially the same as the first embodiment except the following matter. Specifically, this embodiment employs a reverse micro strip line structure such that the ground conductor 25 is formed on the surface (upper side) of the polyimide resin layer 27, and the signal line 29 is interposed between the GaAs substrate 21 and the polyimide resin layer 27.

Figure 13:
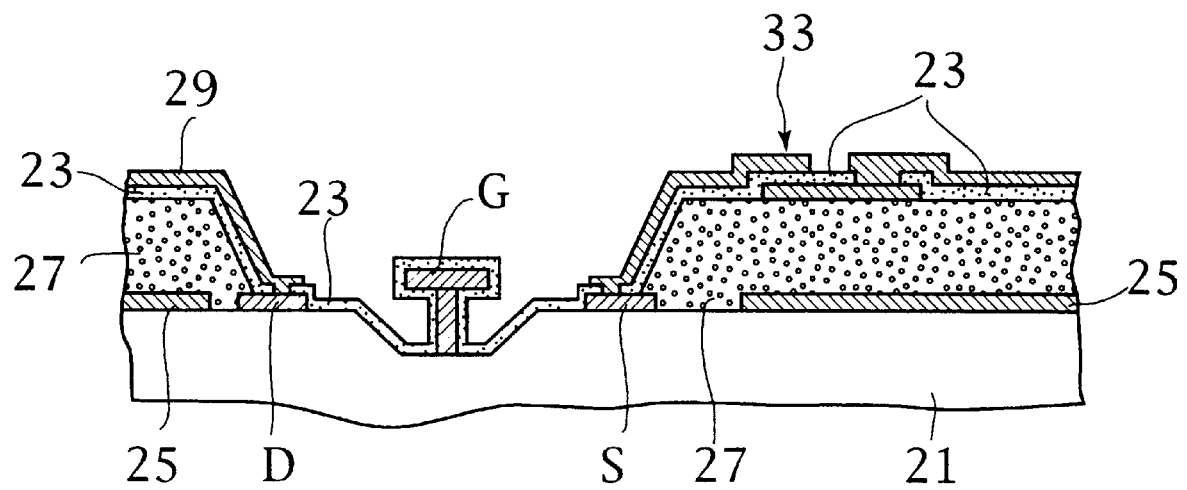
FIG. 13 is a schematic view showing a microwave integrated circuit according to the third embodiment of the present invention.

FIG. 13 shows a third embodiment of the present invention. In a structure of this embodiment, a MIM capacitor 33 is formed on the dielectric film. Specifically, a passivation film which consists of a silicon nitride film 23 of 80 nm and which masks the HEMT surface and the polyimide film 27 surface includes an electrode-to-electrode capacitance of the MIM capacitor. By being constructed in the above manner, the electronic device and polyimide film 27 are passivated by a thin silicon nitride film, and also, the MIM capacitor 33 is simultaneously formed thereon. Therefore, this serves to reduce the number of processes for manufacturing a microwave integrated circuit.

Figure 14:
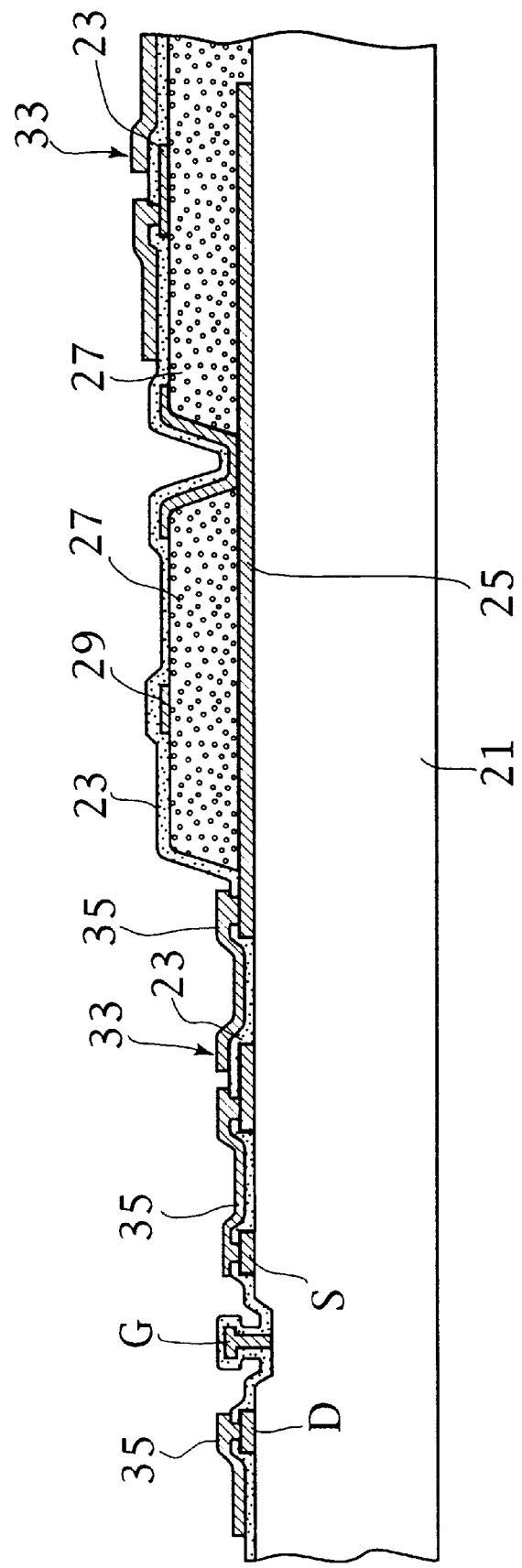
FIG. 14 is a schematic view showing a modification example of the third embodiment of FIG. 13.

FIG. 14 shows a modification example of the third embodiment which is shown in FIG. 13. The MIM capacitor 33 is formed in the vicinity of the HEMT and is connected by an interconnecting line 35.

In the microwave integrated circuit having the structure as described above, high speed performance of the electronic device such as HEMT and MESFET is not reduced even if a surface micro strip line is formed on the electronic device with use of resin such as polyimide. For example, in the case where polyimide with specific dielectric constant 3 is used as an interlayer dielectric of the surface micro strip line, gate-to-source and gate-to-drain capacitance is reduced up to ⅓ of usual according to the present invention.

EXAMPLE

AlGaAs/GaAs HEMTs having a gate length of 0.1 μm and a gate width of 50 μm were manufactured into the structure shown in FIG. 8 and the structure shown in FIG. 11, with use of photosensitive BCB as a dielectric. And then, when making measurement of current gain cutoff frequency Ft and maximum oscillation frequency fmax, the following result was obtained.

Figure 1:
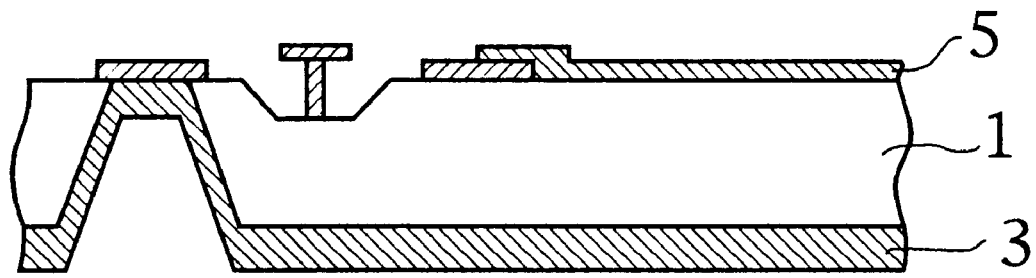
FIG. 1 is a schematic view showing a structure of a conventional microwave integrated circuit.
Figure 2:
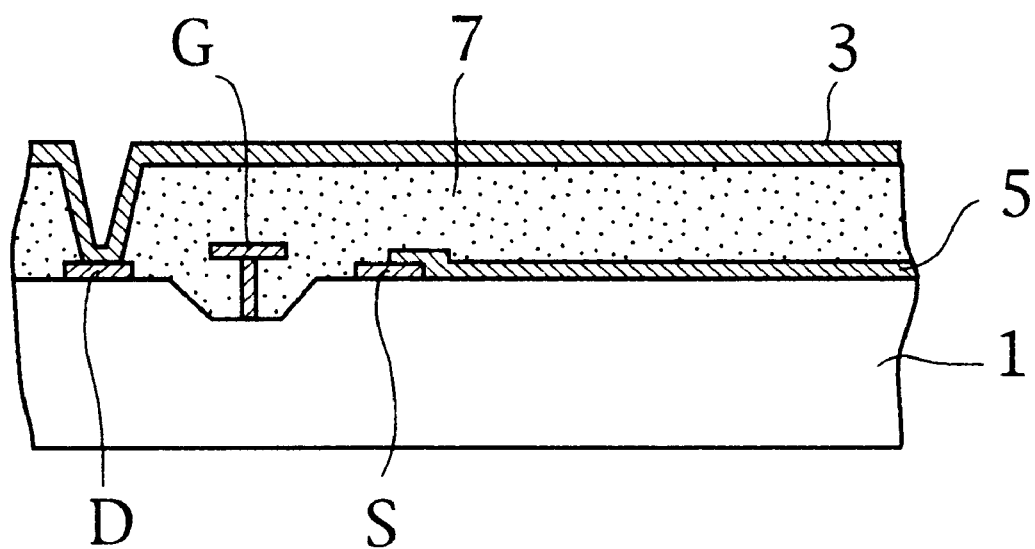
FIG. 2 is a schematic view showing a structure of another conventional microwave integrated circuit.
Figure 3:
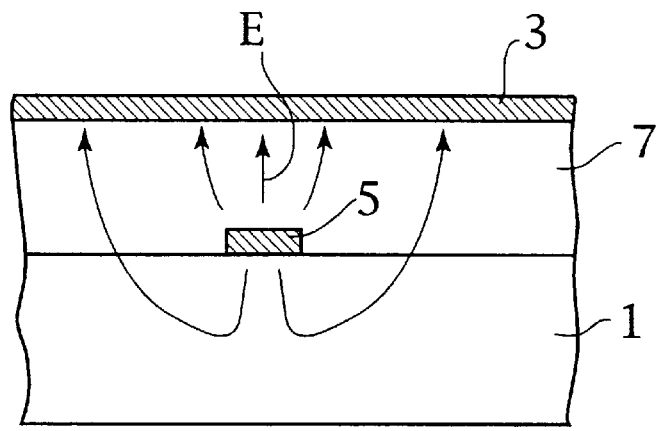
FIG. 3 is a schematic view for explanation of an electric field in the microwave integrated circuit having the structure shown in FIG. 2.
Figure 4:
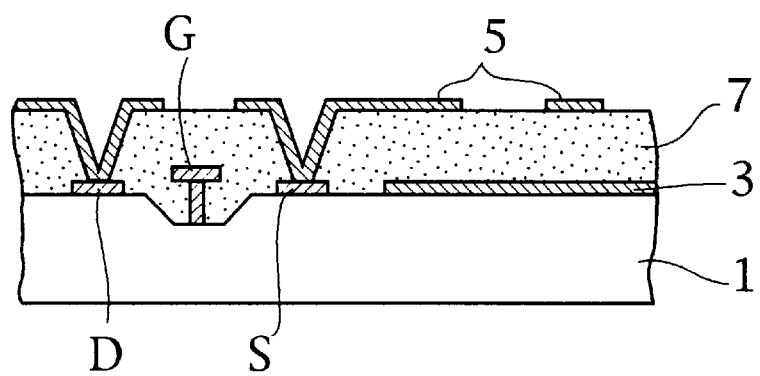
FIG. 4 is a schematic view showing a structure of another conventional microwave integrated circuit.
Figure 5:
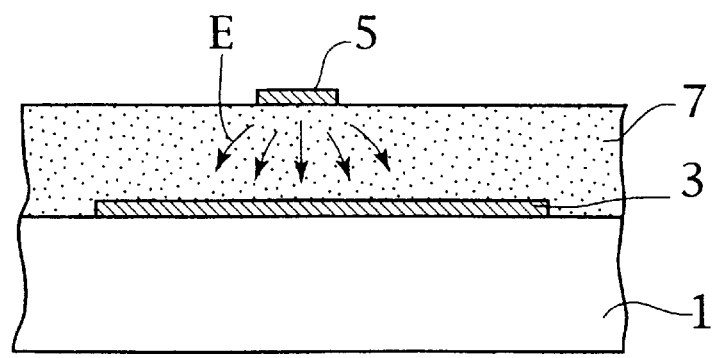
FIG. 5 is a schematic view for explanation of an electric field in the microwave integrated circuit having the structure shown in FIG. 4.
Figure 6:
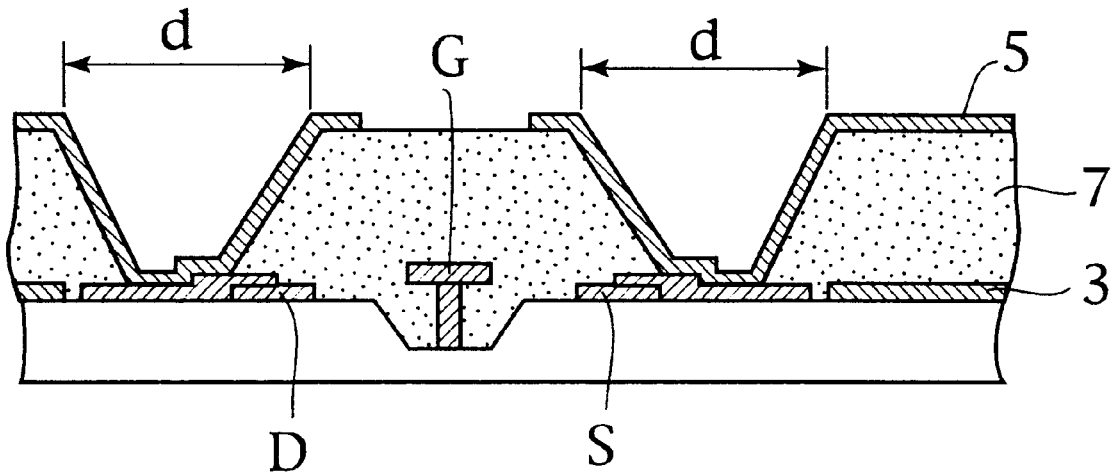
FIG. 6 is a schematic view for explanation of the structure of the microwave integrated circuit shown in FIG. 4.

| Structure | FIG. 6 | FIG. 11 |
| --- | --- | --- |
| F t | 56 GHZ | 61 GHz |
| f max | 90 GHz | 100 GHz |

As is evident from the above explanation, the portion of the BCB layer above the device is removed so that a contact hole is formed. By this structure, the device is not affected by feedback capacitance due to BCB, and also, it can be seen that the maximum oscillation frequency is improved by 10 GHz.

It must be understood that the invention is in no way limited to the above embodiments and that many changes may be brought about therein without departing from the scope of the invention as defined by the appended claims.

What is claimed is:

1. A microwave integrated circuit, comprising:
    a semiconductor substrate on which a field effect transistor is formed, the field effect transistor comprising a gate, a source and a drain;
    a micro strip line comprising a ground conductor, a signal line and a dielectric film interposed between the ground conductor and the signal line, the micro strip line being laminated on the semiconductor substrate:
    a contact hole which is formed in the dielectric film so that the gate and at least one of the source and the drain are exposed to said contact hole; and
    an interconnecting line provided in the contact hole for connecting the gate and the at least one of the source and the drain of the field effect transistor, respectively, with the ground conductor or the signal line of the micro strip line.

2. The microwave integrated circuit as set forth in claim 1, wherein the microwave integrated circuit is a monolithic microwave integrated circuit, and the contact hole is a single contact hole for the field effect transistor.

3. The microwave integrated circuit as set forth in claim 1, wherein the dielectric film is a photosensitive resin.

4. The microwave integrated circuit as set forth in claim 3, wherein the photosensitive resin includes photosensitive polyimide or photosensitive BCB.

5. The microwave integrated circuit as set forth in claim 1, wherein the field effect transistor is a high electron mobility transistor.

6. The microwave integrated circuit as set forth in claim 1, wherein the semiconductor substrate is a GaAs substrate, and the field effect transistor is a HEMT or MESFET.

7. The microwave integrated circuit as set forth in claim 1, wherein the micro strip line is arranged so that the signal line is situated nearer to the semiconductor substrate than the ground conductor, and the interconnecting line connects the ground conductor with the field effect transistor in the contact hole.

8. The microwave integrated circuit as set forth in claim 1, wherein the micro strip line is arranged so that the ground conductor is situated nearer to the semiconductor substrate than the signal line, and the interconnecting line connects the signal line with the field effect transistor in the contact hole.

9. The microwave integrated circuit as set forth in claim 8, wherein the microwave integrated circuit has a plurality of said micro strip lines and a plurality of said interconnecting line in the contact hole so as to connect with the signal line of each of said plurality of the micro strip lines.

10. The microwave integrated circuit as set forth in claim 8, wherein the microwave integrated circuit is further provided with a MIM capacitor which is laminated on the micro strip line.

11. The microwave integrated circuit as set forth in claim 1, wherein the microwave integrated circuit is further provided with a MIM capacitor.

12. The microwave integrated circuit as set forth in claim 1, wherein the microwave integrated circuit is further provided with a passivation film for masking the field effect transistor and the dielectric film.

13. The microwave integrated circuit as set forth in claim 12, wherein the passivation film is formed in such a manner that the passivation film is usable as a dielectric part of the MIM capacitor for generating interelectrode capacitance.

14. The microwave integrated circuit as set forth in claim 1, wherein the interconnecting line connects the ground conductor with the one of the source and the drain and connects the signal line with the other of the source and the drain.

15. The microwave integrated circuit as set forth in claim 1, wherein the interconnecting line connects the source with the signal line and connects the drain with the signal line.

16. A microwave semiconductor device, comprising:
    a semiconductor substrate on which a field effect transistor is formed, the field effect transistor comprising a gate, a source and a drain;
    a micro strip line comprising a ground conductor, a signal line and a dielectric film which is interposed between the ground conductor and the signal line, the micro strip line being laminated on the semiconductor substrate;
    a single hole which is formed on the micro strip line so that the field effect transistor is not substantially covered by the dielectric film, in order to prevent parasitic capacitance accompanying the field effect transistor from being increased by the dielectric film of the micro strip line; and
    an interconnecting line provided in said single hole for connecting the gate and at least one of the source and the drain of the field effect transistor, respectively, with the ground conductor or the signal line of the micro strip line.

17. The microwave semiconductor device as set forth in claim 16, wherein the dielectric film is a photosensitive resin.

18. The microwave semiconductor device as set forth in claim 17, wherein the photosensitive resin includes photosensitive polyimide or photosensitive BCB.

19. The microwave semiconductor device as set forth in claim 16, wherein the interconnecting line connects the ground conductor with the one of the source and the drain and connects the signal line with the other of the source and the drain.

20. The microwave semiconductor device as set forth in claim 16, wherein the interconnecting line connects the source with the signal line and connects the drain with the signal line.

* * * * *